(12) United States Patent
Choi et al.

(10) Patent No.: US 10,851,232 B2
(45) Date of Patent: Dec. 1, 2020

(54) ENCAPSULATING COMPOSITION, ORGANIC ELECTRONIC DEVICE AND METHOD FOR MANUFACTURING THEREOF

(71) Applicant: LG CHEM, LTD., Seoul (KR)

(72) Inventors: Kook Hyun Choi, Daejeon (KR); Joon Hyung Kim, Daejeon (KR); Yu Jin Woo, Daejeon (KR); Mi Lim Yu, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 16/467,216

(22) PCT Filed: Dec. 11, 2017

(86) PCT No.: PCT/KR2017/014483
§ 371 (c)(1),
(2) Date: Jun. 6, 2019

(87) PCT Pub. No.: WO2018/106091
PCT Pub. Date: Jun. 14, 2018

(65) Prior Publication Data
US 2020/0079947 A1    Mar. 12, 2020

(30) Foreign Application Priority Data
Dec. 9, 2016 (KR) .................. 10-2016-0167795

(51) Int. Cl.
*H01L 33/00*  (2010.01)
*C08L 29/10*  (2006.01)
(Continued)

(52) U.S. Cl.
CPC ............ *C08L 29/10* (2013.01); *C08K 5/1525* (2013.01); *C08L 63/00* (2013.01); *C09D 11/38* (2013.01);
(Continued)

(58) Field of Classification Search
CPC ...... H01L 51/5246; C08L 29/10; C08L 63/00; C08L 2203/206; C08K 5/1525; C09D 11/38
See application file for complete search history.

(56) References Cited

U.S. PATENT DOCUMENTS 9,428,606 B2    8/2016  Endo et al.
2007/0213476 A1 *  9/2007  Lee ...................... C08G 59/621
                                                                525/523
(Continued)

FOREIGN PATENT DOCUMENTS

CN    103210012 A    7/2013
JP    2000-143735 A    5/2000
(Continued)

*Primary Examiner* — Phuc T Dang
(74) *Attorney, Agent, or Firm* — Dentons US LLP

(57) ABSTRACT

The present application relates to an encapsulating composition and an organic electronic device comprising the same, and provides an encapsulating composition which can effectively block moisture or oxygen introduced into an organic electronic device from the outside to secure the lifetime of the organic electronic device, is possible to realize a top emission type organic electronic device, is applicable to an inkjet method, can provide a thin display and has excellent adhesion reliability.

19 Claims, 1 Drawing Sheet

(51) Int. Cl.
  *C08K 5/1525* (2006.01)
  *C08L 63/00* (2006.01)
  *C09D 11/38* (2014.01)
  *H01L 51/52* (2006.01)

(52) U.S. Cl.
  CPC .... *H01L 51/5246* (2013.01); *C08L 2203/206* (2013.01)

(56) References Cited

U.S. PATENT DOCUMENTS

| | | | |
|---|---|---|---|
| 2015/0041846 A1* | 2/2015 | Suzuki | C08L 63/00 257/100 |
| 2016/0130432 A1* | 5/2016 | Sumii | B29C 70/06 523/467 |
| 2017/0324040 A1 | 11/2017 | Yamamoto et al. | |

FOREIGN PATENT DOCUMENTS

| | | |
|---|---|---|
| JP | 2008-521962 A | 6/2006 |
| JP | 2010-241959 A | 10/2010 |
| JP | 2011-171294 A | 9/2011 |
| JP | 2014-095053 A | 5/2014 |
| JP | 2014-225380 A | 12/2014 |
| JP | 2016-27120 A | 2/2016 |
| JP | 2016-027124 A | 2/2016 |
| JP | 2016-060744 A | 4/2016 |
| KR | 10-2005-0109500 A | 11/2005 |
| KR | 10-2006-0057615 A | 5/2006 |
| KR | 10-2007-0118139 A | 12/2007 |
| KR | 10-1378817 B1 | 3/2014 |
| KR | 2016-0011228 A | 1/2016 |
| KR | 10-2016-0015226 A | 2/2016 |
| WO | 2016092816 A1 | 6/2016 |

\* cited by examiner

[Figure 1]
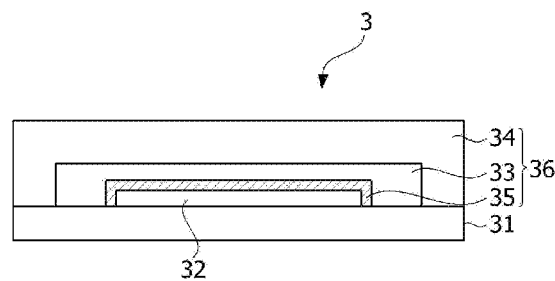
[Figure 2]
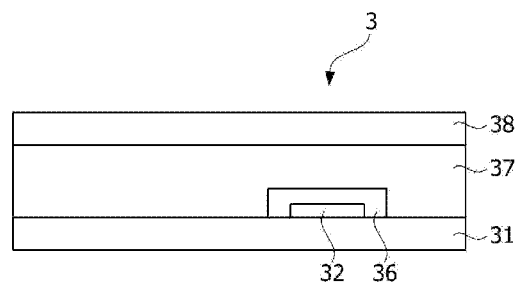

ENCAPSULATING COMPOSITION, ORGANIC ELECTRONIC DEVICE AND METHOD FOR MANUFACTURING THEREOF

CROSS-REFERENCE TO RELATED APPLICATIONS

This application is a U.S. National Phase Application of International Application No. PCT/KR2017/014483, filed on Dec. 11, 2017, which claims the benefit of priority based on Korean Patent Application No. 10-2016-0167795 filed on Dec. 9, 2016, the disclosure of which is incorporated herein by reference in its entirety.

TECHNICAL FIELD

The present application relates to an encapsulating composition, an organic electronic device comprising the same, and a method for manufacturing the organic electronic device.

BACKGROUND ART

An organic electronic device (OED) means a device comprising a layer of an organic material that generates an alternating current of electric charges using holes and electrons, and an example thereof may include a photovoltaic device, a rectifier, a transistor and an organic light emitting diode (OLED), and the like.

The organic light emitting diode (OLED) among the organic electronic devices has lower power consumption and faster response speed, than conventional light sources, and is advantageous for thinning display devices or illuminations. In addition, the OLED has excellent space utilization, so that it is expected to be applied in various fields covering various portable devices, monitors, notebooks, and televisions.

In commercialization and application expansion of OLEDs, the most important problem is a durability problem. Organic materials and metal electrodes, and the like, contained in OLEDs are very easily oxidized by external factors such as moisture. Thus, products comprising OLEDs are highly sensitive to environmental factors. Accordingly, various methods have been proposed to effectively block penetration of oxygen or moisture from the outside into organic electronic devices such as OLEDs.

DISCLOSURE

Technical Problem

The present application provides an encapsulating composition which can effectively block moisture or oxygen introduced into an organic electronic device from the outside to secure the lifetime of the organic electronic device, is possible to realize a top emission type organic electronic device, is applicable to an inkjet method, can provide a thin display and has excellent adhesion reliability, and an organic electronic device comprising the same.

Technical Solution

The present application relates to an encapsulating composition. The encapsulating composition may be a sealing material applied to sealing or encapsulating an organic electronic device such as, for example, an OLED. In one example, the encapsulating composition of the present application can be applied to sealing or encapsulating the entire surface of an organic electronic element. Thus, after the encapsulating composition is applied to the encapsulation, it may be present in an organic layer form sealing the entire surface of the organic electronic element. In this specification, the organic layer, sealing layer and sealing material can be used in the same sense. In addition, the organic layer may be laminated on the organic electronic element together with a protective layer and/or an inorganic layer, which is described below, to form a sealing structure.

In an embodiment of the present application, the present application relates to an encapsulating composition for sealing an organic electronic element applicable to an inkjet process, where the composition may be designed to have appropriate physical properties, when it has been discharged onto a substrate by using inkjet printing capable of non-contact type patterning.

In this specification, the term "organic electronic device" means an article or device having a structure comprising an organic material layer that generates an alternating current of electric charges using holes and electrons between a pair of electrodes facing each other, and an example thereof may include a photovoltaic device, a rectifier, a transistor and an organic light emitting diode (OLED), and the like, but is not limited thereto. In one example of the present application, the organic electronic device may be an OLED.

An exemplary encapsulating composition may comprise a curable compound having a cyclic structure in its molecular structure and a vinyl ether curable compound. The vinyl ether curable compound herein may mean a compound having a vinyl ether group in its molecular structure. In an embodiment of the present application, the encapsulating composition may comprise a curable compound having a cyclic structure in its molecular structure and a vinyl ether curable compound in amounts of 5 to 50 parts by weight and 25 to 80 parts by weight; 8 to 48 parts by weight and 26 to 75 parts by weight; 13 to 45 parts by weight and 28 to 70 parts by weight or 18 to 43 parts by weight and 29 to 68 parts by weight, respectively. In addition, without being limited to the above, the encapsulating composition of the present application may comprise the curable compound having a cyclic structure in its molecular structure in an amount of 25 to 145 parts by weight, 26 to 140 parts by weight, 27 to 138 parts by weight, 28 to 135 parts by weight or 29 to 134 parts by weight, based on 100 parts by weight of the vinyl ether compound. The term "part by weight" herein may mean a weight ratio between the respective components. The present application controls the content ratio of the vinyl ether-containing curable compound and the curable compound having the cyclic structure, thereby realizing excellent flatness when the organic layer is formed by the ink jetting process, preventing damage of an organic electronic element even if the liquid composition is directly applied to the element and also providing excellent curing sensitivity and adhesion after curing.

In one example, the vinyl ether curable compound is not particularly limited as long as it has a vinyl ether group. The vinyl ether curable compound may have monofunctionality or more, or bifunctionality or more, and the upper limit is not particularly limited, which may be 10 or less. Also, the compound may have a cyclic structure in its molecular structure, but is not limited thereto, which may be linear or branched. The term bifunctionality or more may mean that two or more vinyl ether groups are present. Furthermore, when the vinyl ether curable compound has a cyclic structure in its molecular structure, it can be distinguished from the curable compound having the cyclic structure described above by the presence or absence of vinyl ether, and accordingly, the curable compound having a cyclic structure described above may not comprise the vinyl ether group or an oxetane group described below. When the vinyl ether curable compound has a cyclic structure in its molecular structure, the ring constituting atoms in the molecule may be present in a range of 3 to 10, 4 to 8, or 5 to 7. The cyclic structure may be an alicyclic or aromatic ring, but is not limited thereto. For example, the vinyl ether curable compound may be exemplified by 1,4-cyclohexanedimethanol divinyl ether, butanediol monovinyl ether, triethylene glycol divinyl ether or dodecyl vinyl ether, but is not limited thereto.

In an embodiment of the present application, upon applying the encapsulating composition on a substrate in a form of a sealing layer having a thickness of A µm, when the thickness of the side end of the sealing layer after curing is denoted by B µm, (B−A)/A×100 may be 20% or less, 10% or less, or 10.5% or less, and the lower limit may be 0%, without any limitation. Here, the thickness A may mean an average thickness of the sealing layer or a thickness of the sealing layer center. For example, when the encapsulating composition is applied on the substrate in the sealing layer form having a thickness of 10 µm, the thickness of the side end of the sealing layer after curing may be 12 µm or less, 11 µm or less, or 10.5 µm or less. Here, the thickness of the side end of the sealing layer may mean the thickness of the edge of the sealing layer, where the thickest part at the edge middle may be defined as B. Conventionally, when an encapsulating composition is applied on a substrate on which an organic electronic element is formed, an organic layer is formed while the composition is spread on the substrate at the moment the composition is applied, but a defect that a certain size of horn is formed at the edge end of the organic layer occurs. This is referred to as a table top, and it becomes a problem, because the generation of horns at the side ends causes an appearance defect in the appearance of the display and an adhesion defect in the sealing structure. However, even when the encapsulating composition is applied and then cured in the sealing layer form, the present application has superior flatness, whereby the thickness of the side end may not exceed 20% than the thickness of the organic layer. That is, the present application provides a highly reliable organic layer by using the encapsulating composition of the specific composition and adjusting the flatness. In this specification, the side end may mean an area having a width of 0 to 2 mm or 0.1 to 1.8 mm from the outermost side (corner) of the organic layer to the inside of the organic layer.

In this specification, the curable compound may be collectively referred to as a compound having a curable functional group. The curable compound may comprise, for example, a vinyl ether compound, a curable compound having a cyclic structure in its molecular structure and having at least one or more curable functional groups, a linear or branched aliphatic curable compound, or a curable compound having an oxetane group.

In the present application, the curable functional group of the above-mentioned curable compound may be, for example, one or more selected from a vinyl ether group, an oxetane group, a glycidyl group, an isocyanate group, a hydroxyl group, a carboxyl group, an amide group, an epoxide group, a sulfide group, an acetal group and a lactone group. The curable compound may have one or two or more curable functional groups depending on the type thereof, but is not limited thereto, which may have one curable functional group. The upper limit thereof is not particularly limited, which may be 10 or less.

In one example, the encapsulating composition may comprise a curable compound having a cyclic structure in its molecular structure, as described above. In one example, the compound having a cyclic structure in its molecular structure may have ring constituent atoms in the molecular structure in a range of 3 to 10, 4 to 8, or 5 to 7. The curable compound having a cyclic structure may comprise at least one or more curable functional groups, where the curable functional group may be one or more selected from a glycidyl group, an isocyanate group, a hydroxyl group, a carboxyl group, an amide group, an epoxide group, a sulfide group, an acetal group and a lactone group.

In an embodiment of the present application, the encapsulating composition may further comprise a curable compound having an oxetane group. The curable compound having an oxetane group may have bifunctionality or more, whereby two or more oxetane groups may be present in the molecular structure. The upper limit thereof is not particularly limited, which may be 10 or less. By controlling the functional group of the compound having an oxetane group to the above range, the present application can prevent damage to the element due to some un-curing.

The compound having an oxetane group may have a weight average molecular weight in a range of 150 to 1,000 g/mol, 173 to 980 g/mol, 188 to 860 g/mol, 210 to 823 g/mol or 330 to 780 g/mol. By controlling the weight average molecular weight of the compound having an oxetane group to be low, the present application can realize excellent printability when applied to inkjet printing and simultaneously provide moisture barrier property and excellent curing sensitivity. In this specification, the weight average molecular weight means a value converted to standard polystyrene measured by GPC (gel permeation chromatograph). In one example, a column made of a metal tube having a length of 250 to 300 mm and an inner diameter of 4.5 to 7.5 mm is filled with 3 to 20 mm polystyrene beads. When a solution diluted by dissolving a substance to be measured in a THF solvent is passed through the column, the weight average molecular weight can be indirectly measured according to a flowing time. It can be detected by plotting amounts separated from the column by size for each time.

The compound having an oxetane group may have a boiling point in a range of 90 to 300° C., 98 to 270° C., 110 to 258° C., or 138 to 237° C. By controlling the boiling point of the compound to the above range, the present application can provide a sealing material which can have excellent moisture barrier properties from the outside while realizing excellent printability even at a high temperature in an inkjet process, and prevent damage applied to the element due to suppressed outgas. In this specification, the boiling point may be measured at 1 atm, unless otherwise specified.

In one example, in the encapsulating composition, the curable compound having an oxetane group may be comprised in an amount of 5 to 90 parts by weight, 8 to 88 parts by weight, 10 to 83 parts by weight, 15 to 79 parts by weight, 20 to 75 parts by weight, 25 to 73 parts by weight, or 32 to 70 parts by weight, relative to 100 parts by weight of the vinyl ether curable compound. By controlling the content of the curable compound having an oxetane group, the present application can form an organic layer on an organic electronic element by an inkjet method and prevent damage to the element, and the applied encapsulating composition can provide an organic layer which has excellent spreadability in a short time and has excellent curing strength after being cured.

In one example, the encapsulating composition may further comprise a linear or branched aliphatic curable compound. The aliphatic curable compound may have at least two or more curable functional groups, and the upper limit may be 10 or less. Also, the aliphatic curable compound may be included in an amount of 5 parts by weight to 37 parts by weight, or 5 parts by weight to 35 parts by weight or 5.3 parts by weight to 33 parts by weight, relative to 100 parts by weight of the entire curable compound in the composition. By controlling the content of the aliphatic curable compound, the present application makes it possible to prevent haze occurrence due to no reaction or over curing to realize optical characteristics, to prevent element damage in top sealing the organic electronic element, to have appropriate physical properties that can be ink-jetted, to have excellent curing strength after curing, and also to realize excellent moisture barrier properties together.

In one example, the curable compound having a cyclic structure may be an epoxy compound, and when the compound is an epoxy compound, the curable compound having a cyclic structure may have an epoxy equivalent in a range of 50 to 350 g/eq, 73 to 332 g/eq, 94 to 318 g/eq or 123 to 298 g/eq. Also, the linear or branched aliphatic compound may have an epoxy equivalent in a range of 120 e/eq to 375 e/eq or 120 e/eq to 250 e/eq. By controlling the epoxy equivalent to be low, the present application can prevent the viscosity of the composition from becoming excessively high to render the inkjet process impossible, while improving the curing completion degree after curing of the sealing material, and simultaneously provide moisture barrier properties and excellent curing sensitivity. In this specification, the epoxy equivalent is grams (g/eq) of a resin containing one gram equivalent of epoxy group, which can be measured according to the method defined in JIS K 7236.

In one example, the encapsulating composition of the present application may have a contact angle to glass of 30° or less, 25° or less, 20° or less, 15° or less, or 12° or less. The lower limit is not particularly limited, but may be 1° or 3° or more. By adjusting the contact angle to 30° or less, the present application can ensure spreadability in a short time in the inkjet coating, thereby forming an organic layer of a thin film. In the present application, the contact angle may be measured by applying a drop of the encapsulating composition onto glass using a sessile drop measurement method, which may be an average value measured after applying 5 times.

In one example, the compound having a cyclic structure in its molecular structure may be exemplified by limonene dioxide, 3,4-epoxycyclohexylmethyl 3',4'-epoxycyclohexanecarboxylate (EEC) and derivatives, dicyclopentadiene dioxide and derivatives, vinylcyclohexene dioxide and derivatives, or 1,4-cyclohexanedimethanol bis(3,4-epoxycyclohexanecarboxylate) and derivatives, but is not limited thereto.

In this specification, the curable compound having a cyclic structure may be an aliphatic compound, which may be distinguished from the linear or branched aliphatic compound in that it has a cyclic structure. Also, the curable compound having an oxetane group may be a linear, branched or cyclic aliphatic compound, but it may be distinguished from the two compounds mentioned above in that it has an oxetane group. Furthermore, the vinyl ether curable compound is a compound having a vinyl ether group, which may be distinguished from the above three compounds.

In one example, the structure of the curable compound comprising the oxetane group is not limited as long as it has the functional group, and for example, OXT-221, CHOX, OX-SC, OXT101, OXT121, OXT-211, PNOX-1009 or OXT212 from TOAGOSEI, or EHO, OXBP, OXTP or OXMA from ETERNACOLL may be exemplified. Also, the linear or branched aliphatic curable compound may include aliphatic glycidyl ether, 1,4-butanediol diglycidyl ether, ethylene glycol diglycidyl ether, 1,6-hexanediol diglycidyl ether, propylene glycol diglycidyl ether, diethylene glycol diglycidyl ether, butyl glycidyl ether, 2-ethylhexyl glycidyl ether or neopentyl glycol diglycidyl ether, but is not limited thereto.

In an embodiment of the present application, the encapsulating composition may further comprise a surfactant. In one example, the surfactant may comprise a polar functional group, and the polar functional group may be present at the compound structural end of the surfactant. The polar functional group may include, for example, a carboxyl group, a hydroxyl group, a phosphate, an ammonium salt, a carboxylate group, a sulfate or a sulfonate. Furthermore, in an embodiment of the present application, the surfactant may be a non-silicone-based surfactant or a fluorine-based surfactant. The non-silicone-based surfactant or the fluorine-based surfactant may be applied together with the above-mentioned curable compound to provide excellent coating properties on the organic electronic element. On the other hand, in the case of a surfactant comprising a polar reactive group, it may have high affinity with the other components of the encapsulating composition, thereby realizing an excellent effect in terms of adhesion. In an embodiment of the present application, a hydrophilic fluorine-based surfactant or non-silicone-based surfactant may be used to improve coating properties of a base material.

Specifically, the surfactant may be a polymer type or oligomer type fluorine-based surfactant. As the surfactant, a commercially available product may be used, which may be selected from the group consisting of Glide 100, Glide 110, Glide 130, Glide 460, Glide 440, Glide 450 or RAD 2500 from TEGO, Megaface F-251, F-281, F-552, F554, F-560, F-561, F-562, F-563, F-565, F-568, F-570 and F-571 from DIC (DaiNippon Ink Chemicals), or Surflon S-111, S-112, S-113, S-121, S-131, S-132, S-141 and S-145 from Asahi Glass Co., Fluorad FC-93, FC-95, FC-98, FC-129, FC-135, FC-170C, FC-430 and FC-4430 from Sumitomo 3M Ltd., or Zonyl FS-300, FSN, FSN-100 and FSO from DuPont and BYK-350, BYK-354, BYK-355, BYK-356, BYK-358N, BYK-359, BYK-361N, BYK-381, BYK-388, BYK-392, BYK-394, BYK-399, BYK-3440, BYK-3441, BYKETOL-AQ, BYK-DYNWET 800 from BYK, and the like.

The surfactant may be included in an amount of 0.01 to 10 parts by weight, 0.05 to 10 parts by weight, 0.1 to 10 parts by weight, 0.5 to 8 parts by weight, or 1 to 4 parts by weight, relative to 100 parts by weight of the entire curable compound in the composition. Within the content range, the present application makes it possible that the encapsulating composition is applied to an inkjet method to form an organic layer of a thin film.

In an embodiment of the present application, the encapsulating composition may further comprise a photoinitiator. The photoinitiator may be an ionic photoinitiator. Also, the photoinitiator may be a compound absorbing a wavelength in a range of 180 nm to 400 nm. By using the photoinitiator, the present application can realize excellent curing properties in a specific composition of the present application.

In one example, the photoinitiator may be a cationic photopolymerization initiator. As the cationic photopolymerization initiator, a known material in the art can be used and for example, it may include a compound having a cation moiety comprising aromatic sulfonium, aromatic iodonium, aromatic diazonium or aromatic ammonium and an anion moiety comprising $AsF_6^-$, $SbF_6^-$, $PF_6^-$, or tetrakis(pentafluorophenyl) borate. Furthermore, as the cationic photopolymerization initiator, an ionized cationic initiator of onium salt or organometallic salt series or a non-ionized cationic photopolymerization initiator of organic silane or latent sulfonic acid series can be exemplified. Diaryliodonium salt, triarylsulfonium salt or aryldiazonium salt and the like can be exemplified as the initiator of the onium salt series, iron arene or the like can be exemplified as the initiator of the organometallic salt series, o-nitrobenzyl triaryl silyl ether, triaryl silyl peroxide or an acyl silane and the like can be exemplified as the initiator of the organosilane series, and α-sulfonyloxy ketone or α-hydroxymethylbenzoin sulfonate and the like can be exemplified as the initiator of the latent sulfuric acid series, without being limited thereto.

In one example, the encapsulating composition of the present application may comprise a photoinitiator comprising a sulfonium salt as the photoinitiator in the above-mentioned specific composition, so as to be suitable for a use sealing an organic electronic element by an inkjet method. Even if the encapsulating composition according to the above composition is directly sealed on the organic electronic element, it can prevent chemical damage from being applied to the element due to a small amount of generated outgas. Furthermore, the photoinitiator comprising a sulfonium salt may also have excellent solubility, thereby being suitably applied to an inkjet process.

In an embodiment of the present application, the photoinitiator may be present in an amount of 0.1 to 15 parts by weight, 0.2 to 13 parts by weight, 0.3 to 11 parts by weight, 1 to 9 parts by weight, 2 to 8 parts by weight or 3 to 5 parts by weight, relative to 100 parts by weight of the entire curable compound in the composition. By controlling the photoinitiator content range, due to the nature of the composition that is directly applied on an organic electronic element, the present application can minimize physical and chemical damage to the element.

In an embodiment of the present application, the encapsulating composition may further comprise a photosensitizer in order to complement the curing property at a long wavelength activation energy beam of 300 nm or more. The photosensitizer may be a compound that absorbs a wavelength in a range of 200 nm to 400 nm.

The photosensitizer may be one or more selected from the group consisting of an anthracene-based compound such as anthracene, 9,10-dibutoxyanthracene, 9,10-dimethoxyanthracene, 9,10-diethoxyanthracene and 2-ethyl-9,10-dimethoxyanthracene; a benzophenone-based compound such as benzophenone, 4,4-bis(dimethylamino)benzophenone, 4,4-bis(diethylamino)benzophenone, 2,4,6-trimethylaminobenzophenone, methyl-o-benzolybenzoate, 3,3-dimethyl-4-methoxybenzophenone and 3,3,4,4-tetra(t-butylperoxycarbonyl)benzophenone; a ketone-based compound such as acetophenone, dimethoxyacetophenone, diethoxyacetophenone, 2-hydroxy-2-methyl-1-phenylpropan-1-one and propanone; perylene; a fluorene-based compound such as 9-fluorenone, 2-chloro-9-proprenone and 2-methyl-9-fluorenone; a thioxanthone-based compound such as thioxanthone, 2,4-diethylthioxanthone, 2-chlorothioxanthone, 1-chloro-4-propyloxythioxanthone, isopropylthioxanthone (ITX) and diisopropylthioxanthone; a xanthone-based compound such as xanthone and 2-methylxanthone; an anthraquinone-based compound such as anthraquinone, 2-methylanthraquinone, 2-ethylanthraquinone, t-butylanthraquinone and 2,6-dichloro-9,10-anthraquinone; an acridine-based compound such as 9-phenylacridine, 1,7-bis(9-acridinyl)heptane, 1,5-bis(9-acridinylpentane) and 1,3-bis(9-acridinyl)propane; a dicarbonyl compound such as benzyl, 1,7,7-trimethyl-bicyclo[2,2,1]heptane-2,3-dione and 9,10-phenanthrenequinone; a phosphine oxide-based compound such as 2,4,6-trimethylbenzoyldiphenylphosphine oxide and bis(2,6-dimethoxybenzoyl)-2,4,4-trimethylpentylphosphine oxide; a benzoate-based compound such as methyl-4-(dimethylamino) benzoate, ethyl-4-(dimethylamino) benzoate and 2-n-butoxyethyl-4-(dimethylamino) benzoate; an amino synergist such as 2,5-bis(4-diethylaminobenzal)cyclopentanone, 2,6-bis(4-diethylaminobenzal)cyclohexanone and 2,6-bis(4-diethylaminobenzal)-4-methyl-cyclopentanone; a coumarin-based compound such as 3,3-carbonylvinyl-7-(diethylamino)coumarin, 3-(2-benzothiazolyl)-7-(diethylamino)coumarin, 3-benzoyl-7-(diethylamino) coumarin, 3-benzoyl-7-methoxy-coumarin and 10,10-carbonylbis[1,1,7,7-tetramethyl-2,3,6,7-tetrahydro-1H,5H, 11H-Cl]-[6,7,8-ij]-quinolizin-11-one; a chalcone compound such as 4-diethylaminochalcone and 4-azidobenzalacetophenone; 2-benzoylmethylene; and 3-methyl-b-naphthothiazoline.

The photosensitizer may be included in a range of 28 to 55 parts by weight, 31 to 52 parts by weight or 32 to 40 parts by weight, relative to 100 parts by weight of the photoinitiator. By controlling the content of the photosensitizer, the present invention can realize a synergistic action of curing sensitivity at a desired wavelength, and also prevent the photosensitizer from lowering the adhesive force by not dissolving in the inkjet coating.

The encapsulating composition of the present application may further comprise a coupling agent. The present application can improve adhesiveness of a cured product of the encapsulating composition to an adherend or moisture transmission resistance of the cured product. The coupling agent may include, for example, a titanium-based coupling agent, an aluminum-based coupling agent, or a silane coupling agent.

In an embodiment of the present application, the silane coupling agent may include, specifically, an epoxy-based silane coupling agent such as 3-glycidyloxypropyltrimethoxysilane, 3-glycidyloxypropyltriethoxysilane, 3-glycidyloxypropyl (dimethoxy)methylsilane and 2-(3,4-epoxycyclohexyl)ethyltrimethoxysilane; a mercapto-based silane coupling agent such as 3-mercaptopropyltrimethoxysilane, 3-mercaptopropyltriethoxysilane, 3-mercaptopropylmethyldimethoxysilane and 11-mercaptoundecyltrimethoxysilane; an amino-based silane coupling agent such as 3-aminopropyltrimethoxysilane, 3-aminopropyltriethoxysilane, 3-aminopropyldimethoxymethylsilane, N-phenyl-3-aminopropyltrimethoxysilane, N-methylaminopropyltrimethoxysilane, N-(2-aminoethyl)-3-aminopropyltrimethoxysilane and N-(2-aminoethyl)-3-aminopropyldimethoxymethylsilane; a ureide-based silane coupling agent such as 3-ureidepropyltriethoxysilane; a vinyl-based silane coupling agent such as vinyltrimethoxysilane, vinyltriethoxysilane and vinylmethyldiethoxysilane; a styryl-based silane coupling agent such as p-styryltrimethoxysilane; an acrylate-based silane coupling agent such as 3-acryloxypropyltrimethoxysilane and 3-methacryloxypropyltrimethoxysilane; an isocyanate-based silane coupling agent such as 3-isocyanatopropyltrimethoxysilane; a sulfide-based silane coupling agent such as bis(triethoxysilylpropyl)disulfide and bis(triethoxysilylpropyl)tetrasulfide; phenyltrimethoxysilane, methacryloxypropyltrimethoxysilane, imidazolesilane, triazinesilane, and the like.

In the present application, the coupling agent may be included in an amount of 0.1 to 10 parts by weight or 0.5 to 4.5 parts by weight, relative to 100 parts by weight of the entire curable compound in the composition. Within the above range, the present application can realize an effect of improving the adhesiveness by the addition of the coupling agent.

The encapsulating composition of the present application may comprise, if necessary, a moisture adsorbent. The term "moisture adsorbent" can be used to generically mean a component capable of adsorbing or removing moisture or humidity introduced from the outside through a physical or chemical reaction or the like. That is, it means a moisture-reactive adsorbent or a physical adsorbent, and a mixture thereof is also usable.

A specific kind of the usable moisture adsorbent in the present application is not particularly limited, which may include, for example, one or a mixture of two or more of a metal oxide, a metal salt or phosphorus pentoxide ($P_2O_5$), and the like, in the case of a moisture-reactive adsorbent, and may include zeolite, zirconia or montmorillonite, and the like, in the case of the physical adsorbent.

The encapsulating composition of the present application may comprise the moisture adsorbent in an amount of 5 parts by weight to 100 parts by weight, 5 to 80 parts by weight, 5 parts by weight to 70 parts by weight or 10 to 30 parts by weight, relative to 100 parts by weight of the entire curable compound in the composition. As the encapsulating composition of the present application preferably controls the content of the moisture adsorbent to 5 parts by weight or more, the present application can make the encapsulating composition or the cured product thereof exhibit excellent moisture and humidity barrier properties. In addition, by controlling the content of the moisture adsorbent to 100 parts by weight or less, the present application can provide a thin film sealing structure.

In one example, the encapsulating composition may further comprise an inorganic filler, if necessary. The specific type of the usable filler in the present application is not particularly limited, and for example, one or a mixture of two or more of clay, talc, alumina, calcium carbonate, silica, and the like may be used.

The encapsulating composition of the present application may comprise 0 to 50 parts by weight, 1 to 40 parts by weight, 1 to 20 parts by weight, or 1 to 10 parts by weight of inorganic filler, relative to 100 parts by weight of the entire curable compound in the composition. The present application can provide a sealing structure having excellent moisture or humidity barrier properties and mechanical properties by controlling the inorganic filler, preferably, to 1 part by weight or more. Furthermore, by controlling the content of the inorganic filler to 50 parts by weight or less, the present invention can provide a cured product exhibiting excellent moisture barrier properties even when formed into a thin film.

In addition to the above-mentioned constitutions, the encapsulating composition according to the present application may comprise various additives in the range without affecting the above-described effects of invention. For example, the encapsulating composition may comprise a defoamer, a tackifier, an ultraviolet stabilizer or an antioxidant and the like in an appropriate range of content depending on the desired physical properties.

In one example, the encapsulating composition may be in a liquid phase at room temperature, for example, at about 25° C. In an embodiment of the present application, the encapsulating composition may be in a solventless type liquid phase. The encapsulating composition may be applied to sealing an organic electronic element, and specifically, may be applied to sealing the entire surface of the organic electronic element. As the encapsulating composition has a liquid form at room temperature, the present application can seal the organic electronic element by a method of applying the composition to the side of the element.

Also, the encapsulating composition of the present application may be an ink composition. The encapsulating composition of the present application may be an ink composition capable of an inkjet process. The encapsulating composition of the present application may have a specific composition and physical properties so that ink-jetting can be performed.

In one example, the encapsulating composition of the present application may have an amount of volatile organic compounds measured after curing of 200 ppm or less, 100 ppm or less, or less than 50 ppm. The volatile organic compounds may be measured after curing the encapsulating composition and then holding a sample of the cured product at 110° C. for 30 minutes using Purge & Trap-gas chromatography/mass spectrometry. The measurement may be performed using a Purge & Trap sampler (JAI JTD-505 III)-GC/MS (Agilent 7890b/5977a) instrument.

Furthermore, in an embodiment of the present application, the encapsulating composition may have a viscosity in a range of 50 cPs or less, 1 to 46 cPs, or 5 to 44 cPs, as measured by Brookfield's DV-3 at a temperature of 25° C., a torque of 90% and a shear rate of 100 rpm. By controlling the viscosity of the composition within the above range, the present application can increase coating properties at the time of being applied to an organic electronic element to provide a sealing material of a thin film.

In one example, the encapsulating composition may have a surface energy of the cured product after curing in a range of 5 mN/m to 45 mN/m, 10 mN/m to 40 mN/m, 15 mN/m to 35 mN/m, or 20 mN/m to 30 mN/m. The surface energy can be measured by a method known in the art, and for example, can be measured by a ring method. The present application can realize excellent coating properties in the above surface energy range.

Also, in an embodiment of the present application, the encapsulating composition may have a light transmittance of 90% or more, 92% or more, or 95% or more in the visible light region after curing. Within the above range, the present application provides an organic electronic device having high-resolution, low power consumption and long-life by applying the encapsulating composition to a top emission type organic electronic device. Furthermore, the encapsulating composition of the present application may have a haze of 3% or less, 2% or less or 1% or less according to JIS K7105 standard test after curing, and the lower limit is not particularly limited, but may be 0%. Within the haze range, the encapsulating composition may have excellent optical properties after curing. In this specification, the above-mentioned light transmittance or haze may be measured in a state where the encapsulating composition is cured to an organic layer, and may be optical characteristics measured when the thickness of the organic layer is any one thickness of 2 μm to 50 μm. In an embodiment of the present application, in order to realize the optical characteristics, the above-mentioned moisture adsorbent or inorganic filler may not be included.

The present application also relates to an organic electronic device. As shown in FIG. 1, an exemplary organic electronic device (3) may comprise a substrate (31); an organic electronic element (32) formed on the substrate (31); and an organic layer (33) sealing the entire surface of the organic electronic element (32) and comprising the above-described encapsulating composition.

In the present application, the organic layer may be an organic thin film layer, and may form a sealing structure together with an inorganic layer to be described below.

In an embodiment of the present application, the organic electronic element may comprise a first electrode layer, an organic layer formed on the first electrode layer and containing at least a light emitting layer, and a second electrode layer formed on the organic layer. The first electrode layer may be a transparent electrode layer or a reflective electrode layer, and the second electrode layer may also be a transparent electrode layer or a reflective electrode layer. More specifically, the organic electronic element may comprise a reflective electrode layer formed on a substrate, an organic layer formed on the reflective electrode layer and containing at least a light emitting layer, and a transparent electrode layer formed on the organic layer.

In the present application, the organic electronic element (32) may be an organic light emitting diode.

In one example, the organic electronic device according to the present application may be a top emission type, but is not limited thereto, and may be applied to a bottom emission type.

The organic electronic device may further comprise a protective layer (35) for protecting the electrodes and the light emitting layer of the element. The protective layer (35) may be an inorganic protective layer. The protective layer may be a protective layer by chemical vapor deposition (CVD), where as the material, a known inorganic material may be used and for example, silicon nitride (SiNx) may be used. In one example, silicon nitride (SiNx) used as the protective layer can be deposited to a thickness of 0.01 μm to 5 μm.

In an embodiment of the present application, the organic electronic device (3) may further comprise an inorganic layer (34) formed on the organic layer (33). The material of the inorganic layer (34) is not limited, which may be the same as or different from the above-described protective layer. In one example, the inorganic layer may be one or more metal oxides or nitrides selected from the group consisting of Al, Zr, Ti, Hf, Ta, In, Sn, Zn and Si. The inorganic layer may have a thickness of 5 to 100 nm, 10 nm to 90 nm, or 10 to 80 nm. In one example, the inorganic layer of the present application may be an inorganic material without any dopant, or may be an inorganic material containing a dopant. The dopant which may be doped may be one or more elements selected from the group consisting of Ga, Si, Ge, Al, Sn, Ge, B, In, Tl, Sc, V, Cr, Mn, Fe, Co and Ni, or an oxide of the element, but is not limited thereto.

In one example, the organic layer may have a thickness in a range of 2 μm to 20 μm, 2.5 μm to 15 μm, and 2.8 μm to 9 μm. The present application may provide a thin-film organic electronic device by providing a thin organic layer.

The organic electronic device (3) of the present application may comprise a sealing structure comprising the organic layer (33) and the inorganic layer (34), as described above, where the sealing structure may comprise at least one or more organic layers and at least one or more inorganic layers, and the organic layer and the inorganic layer may be repeatedly laminated. For example, the organic electronic device may have a structure of substrate/organic electronic element/protective layer/(organic layer/inorganic layer)n, where n may be a number in a range of 1 to 100. FIG. 1 is a cross-sectional view exemplarily showing a case where n is 1.

In one example, the organic electronic device (3) of the present application may further comprise a cover substrate present on the organic layer (33). The material of the substrate and/or the cover substrate is not particularly limited, and a known material in the art may be used. For example, the substrate or the cover substrate may be glass, a metal base material or a polymer film. As the polymer film, for example, a polyethylene terephthalate film, a polytetrafluoroethylene film, a polyethylene film, a polypropylene film, a polybutene film, a polybutadiene film, a vinyl chloride copolymer film, a polyurethane film, an ethylene-vinyl acetate film, an ethylene-propylene copolymer film, an ethylene-ethyl acrylate copolymer film, an ethylene-methyl acrylate copolymer film or a polyimide film and the like may be used.

Also, as shown in FIG. 2, the organic electronic device (3) may further comprise a encapsulation layer (37) existing between the cover substrate (38) and the substrate (31) on which the organic electronic element (32) is formed. The encapsulation layer (37) may be applied as a use for attaching the substrate (31) on which the organic electronic element (32) is formed and the cover substrate (38), which may be, for example, a pressure-sensitive adhesive film or an adhesive film, but is not limited thereto. The encapsulation layer (37) may seal the entire surface of the sealing structure (36) of the above-described organic layer and inorganic layer, laminated on the organic electronic element (32).

The present application also relates to a method for manufacturing an organic electronic device.

In one example, the manufacturing method may comprise a step of forming an organic layer (33) on a substrate (31) in which an organic electronic element (32) is formed on its upper part, so that the above-described encapsulating composition seals the entire surface of the organic electronic element (32).

Here, the organic electronic element (32) may be produced by forming a reflective electrode or a transparent electrode on a substrate (31) such as glass or a polymer film, as a substrate (31), by a method such as vacuum deposition or sputtering, and forming an organic material layer on the reflective electrode. The organic material layer may comprise a hole injecting layer, a hole transporting layer, a light emitting layer, an electron injecting layer, and/or an electron transporting layer. Subsequently, a second electrode is further formed on the organic material layer. The second electrode may be a transparent electrode or a reflective electrode.

The manufacturing method of the present application may further comprise a step of forming a protective layer (35) on the first electrode, the organic material layer and the second electrode, formed on the substrate (31). Then, the above-described organic layer (33) is applied to cover the entire surface of the organic electronic element (32) on the substrate (31). Here, the step of forming the organic layer (33) is not particularly limited and the above-described encapsulating composition may be applied to the entire surface of the substrate (31) using a process such as inkjet printing, gravure coating, spin coating, screen printing or reverse offset coating.

The manufacturing method may further comprise a step of irradiating the organic layer with light. In the present invention, a curing process may also be performed on an organic layer sealing an organic electronic device, and such a curing process may be performed, for example, in a heating chamber or a UV chamber, and preferably, may be performed in a UV chamber.

In one example, after the above-described encapsulating composition is applied to form a entire surface organic layer, the composition can be irradiated with light to induce cross-linking. The irradiation of light may comprise irradiating with light having a wavelength range of 250 nm to 450 nm or 300 nm to 450 nm region bands at a light quantity of 0.3 to 6 J/cm$^2$ or a light quantity of 0.5 to 5 J/cm$^2$.

In addition, the manufacturing method of the present application may further comprise a step of forming an inorganic layer (34) on the organic layer (33). As the step of forming an inorganic layer, a known method in the art may be used, which may be the same as or different from the above-described method of forming a protective layer.

Advantageous Effects

The present application provides an encapsulating composition which can effectively block moisture or oxygen introduced into an organic electronic device from the outside to secure the lifetime of the organic electronic device, is possible to realize a top emission type organic electronic device, is applicable to an inkjet method, can provide a thin display and has excellent adhesion reliability, and an organic electronic device comprising the same.

BRIEF DESCRIPTION OF DRAWINGS

FIGS. 1 and 2 are cross-sectional views showing an organic electronic device according to one example of the present invention.

EXPLANATION OF REFERENCE NUMERALS

3: organic electronic device
31: substrate
32: organic electronic element
33: organic layer
34: inorganic layer
35: protective layer
36: sealing structure
37: encapsulation layer
38: cover substrate

BEST MODE

Hereinafter, the present invention will be described in more detail through Examples according to the present invention and Comparative Examples not complying with the present invention, but the scope of the present invention is not limited by the following examples.

Hereinafter, in Examples and Comparative Examples, alicyclic epoxy compounds, Celloxide 2021P (hereinafter, CEL2021P) and limonene dioxide (LDO) from Daicel, were used as curable compounds having a cyclic structure. As a vinyl ether curable compound, 1,4-cyclohexanedimethanol divinyl ether (CHDVE) was used. As oxetane group-containing curable compounds, OXT-221, 3-(allyloxy)oxetane and 3-ethyl-3 [(2-ethylhexyloxy)methyl]oxetane from TOAGOSEI were used. Also, TTA UV-694 (hereinafter, UV694), an iodonium salt photoinitiator from Tetrachem, was used as a photoinitiator, and F430 from DIC, a fluorine-based surfactant, was used as a surfactant. Furthermore, a silane coupling agent (KBM-403) was used as a coupling agent and 2-isopropylthioxanthone (ITX) was used as a photosensitizer. In addition, 2,6-di-tert-butyl-p-cresol (BHT from SIGMA aldrich) was used as a heat stabilizer.

Examples 1 to 8

The above compositions were formulated in weight ratios as in Table 1 below, and introduced into a mixing vessel.

In the mixing vessel, uniform encapsulating composition inks were prepared using a planetary mixer (Kurabo, KK-250s).

Comparative Examples 1 to 4

The above compositions were formulated in weight ratios as in Table 2 below, and introduced into a mixing vessel. The unit is part by weight.

In the mixing vessel, uniform encapsulating composition inks were prepared using a planetary mixer (Kurabo, KK-250s).

TABLE 1

| | Example | | | | | | | |
|---|---|---|---|---|---|---|---|---|
| | 1 | 2 | 3 | 4 | 5 | 6 | 7 | 8 |
| LDO | 10 | 30 | 20 | 10 | 10 | 10 | 10 | 5 |
| CEL2021P | 10 | 10 | 10 | 10 | 10 | 10 | 10 | 5 |
| CHDVE | 55 | 30 | 40 | 50 | 65 | 55 | 50 | 30 |
| 3-(allyloxy)-oxetane | | | | | | 17 | | |
| 3-ethyl-3[(2-ethylhexyloxy)-methyl]oxetane | | | | | | | 22 | |
| OXT-221 | 17 | 22 | 22 | 22 | 7 | | | 52 |
| UV694 | 1 | 1 | 1 | 1 | 1 | 1 | 1 | 1 |
| F430 | 1 | 1 | 1 | 1 | 1 | 1 | 1 | 1 |
| KBM-403 | 5 | 5 | 5 | 5 | 5 | 5 | 5 | 5 |
| ITX | 0.5 | 0.5 | 0.5 | 0.5 | 0.5 | 0.5 | 0.5 | 0.5 |
| BHT | 0.5 | 0.5 | 0.5 | 0.5 | 0.5 | 0.5 | 0.5 | 0.5 |

TABLE 2

| | Comparative Example | | | |
|---|---|---|---|---|
| | 1 | 2 | 3 | 4 |
| LDO | 92 | | | |
| CEL2021P | | 92 | | |
| CHDVE | | | 92 | |
| OXT-221 | | | | 92 |
| UV694 | 1 | 1 | 1 | 1 |
| F430 | 1 | 1 | 1 | 1 |
| KBM-403 | 5 | 5 | 5 | 5 |
| ITX | 0.5 | 0.5 | 0.5 | 0.5 |
| BHT | 0.5 | 0.5 | 0.5 | 0.5 |

Physical properties in Examples and Comparative Examples were evaluated in the following manner.

1. Horn Step Measurement

The encapsulating compositions prepared in Examples and Comparative Examples are each coated on a substrate to a thickness of about 50 μm and UV-cured at an intensity of 1000 mW/cm$^2$ through a light quantity of 4000 mJ/cm$^2$ to form a sealing layer. Using an Alpha step (KLA-Tencor) instrument, the thickness A of the sealing layer is measured, and at the same time, the thickest area of the edge side end of the sealing layer is measured as the thickness B. At this time, by calculating by (B−A)/A×100, it is determined how much the horn step has occurred relative to the thickness of the sealing layer. When the horn step is 20% or less, it is classified as a good level.

2. Curing Sensitivity Measurement

The encapsulating compositions prepared in Examples and Comparative Examples were each irradiated with UV of 1 J/cm² at an intensity of 1000 mW/cm² and then the tack free time of each adhesive was measured. First, the encapsulating composition is applied by spin coating to a thickness of 10 μm and cured. A time until a tacky feeling disappears and there is no leakage of the sealing material when the surface of the sealing material has been touched immediately after curing, is defined as a tack free time and measured. It was classified as ⊚ in the case where the tack free time was less than 1 second, as O in the case where it was less than 1 minute, as Δ in the case where it was 5 minutes or more and as X in the case where it was 30 minutes or more.

3. Outgas Measurement

The encapsulating compositions prepared in Examples and Comparative Examples were each cured by irradiation with UV of 1 J/cm² at an intensity of 1000 mW/cm², and 50 mg of each sample of the cured products was maintained at 110° C. for 30 minutes using Purge & Trap-gas chromatography/mass spectrometry and then the amount of volatile organic compounds was measured. The measurement was performed using a Purge & Trap sampler (JAI JTD-505 III)-GC/MS (Agilent 7890b/5977a) instrument. It was represented as ⊚ in the case where the measured amount was less than 50 ppm, as O in the case where it was 100 ppm or less and as X in the case where it was more than 100 ppm.

4. Dark Spot

The ink compositions prepared in Examples and Comparative Examples were each ink-jetted on a substrate, on which an organic electronic element was formed, by using Unijet UJ-200 (Inkjet head-Dimatix 10Pl 256) to form an organic layer having a pattern size of 1×10 cm and a thickness of 10 μm. The applied ink composition was heat-treated at 100° C. for 3 minutes using a hot plate. The ink composition was cured by irradiation with UV of 1 J/cm² at a wavelength of 395 nm and an intensity of 1000 mW/cm² under a condition of 5% relative humidity to produce an organic electronic device.

The produced organic electronic device is observed for dark spots under constant temperature and humidity conditions of 85° C. and 85% RH. It is checked whether or not dark spots are generated by observing it for 300 hours. It was classified as in the case where no dark spot was generated, as O in the case where one or less dark spot was generated, as A in the case where five or less dark spots were generated and as X in the case where more than five dark spots were observed.

TABLE 3

|  |  | Horn step (%) | Curing sensitivity | Outgas | Dark spot |
|---|---|---|---|---|---|
| Example | 1 | 9 | ⊚ | ⊚ | ⊚ |
|  | 2 | 8 | ⊚ | ⊚ | ⊚ |
|  | 3 | 8 | ⊚ | ⊚ | ⊚ |
|  | 4 | 7 | ⊚ | ⊚ | ⊚ |
|  | 5 | 7 | ⊚ | ⊚ | ⊚ |
|  | 6 | 10 | ⊚ | ⊚ | Δ |
|  | 7 | 9 | ⊚ | ⊚ | Δ |
|  | 8 | 7 | ⊚ | ⊚ | Δ |
| Comparative Example | 1 | 8 | X | X | X |
|  | 2 | 30 | O | ⊚ | X |
|  | 3 | 9 | O | X | X |
|  | 4 | 22 | O | O | X |

The invention claimed is:

1. An encapsulating composition comprising:
   5 to 50 parts by weight of a curable compound having a cyclic structure in its molecular structure, and
   25 to 80 parts by weight of a vinyl ether curable compound,
   wherein the curable compound having a cyclic structure does not comprise an vinyl ether group and an oxetane group.

2. The encapsulating composition according to claim 1, wherein the encapsulating composition satisfies Equation 1:

$$(B-A)/A \times 100 \leq 20 (\%) \quad \text{[Equation 1]}$$

wherein, A is a thickness (μm) of the encapsulating composition in a form of a sealing layer when the encapsulating composition is applied on a substrate, and B is a thickness (μm) of a side end of the sealing layer after curing.

3. The encapsulating composition according to claim 1, wherein the curable compound having a cyclic structure comprises at least one or more curable functional groups.

4. The encapsulating composition according to claim 3, wherein the curable functional group is one or more selected from the group consisting of a glycidyl group, an isocyanate group, a hydroxyl group, a carboxyl group, an amide group, an epoxide group, a sulfide group, an acetal group and a lactone group.

5. The encapsulating composition according to claim 1, wherein the curable compound having a cyclic structure in its molecular structure has ring constituent atoms in the molecular structure in a range of 3 to 10.

6. The encapsulating composition according to claim 1, wherein the curable compound having a cyclic structure in its molecular structure is comprised in an amount of 25 to 145 parts by weight relative to 100 parts by weight of the vinyl ether curable compound.

7. The encapsulating composition according to claim 1, further comprising a curable compound having an oxetane group.

8. The encapsulating composition according to claim 7, wherein the curable compound having an oxetane group has bifunctionality or more.

9. The encapsulating composition according to claim 7, wherein the curable compound having an oxetane group is comprised in an amount of 5 to 90 parts by weight relative to 100 parts by weight of the vinyl ether curable compound.

10. The encapsulating composition according to claim 1, further comprising a surfactant.

11. The encapsulating composition according to claim 10, wherein the surfactant comprises a polar functional group.

12. The encapsulating composition according to claim 10, wherein the surfactant comprises a fluorine-based compound.

13. The encapsulating composition according to claim 10, wherein the surfactant is comprised in an amount of 0.01 parts by weight to 10 parts by weight relative to 100 parts by weight of the entire curable compound in the composition.

14. The encapsulating composition according to claim 1, further comprising a photoinitiator.

15. The encapsulating composition according to claim 14, wherein the photoinitiator is comprised in an amount of 1 to 15 parts by weight relative to 100 parts by weight of the entire curable compound in the composition.

16. The encapsulating composition according to claim 1, wherein the encapsulating composition is a solventless type ink composition.

17. An organic electronic device comprising a substrate; an organic electronic element formed on the substrate; and an organic layer sealing the entire surface of the organic electronic element and comprising the encapsulating composition according to claim 1.

18. A method for manufacturing an organic electronic device comprising a step of forming an organic layer on a substrate in which an organic electronic element is formed on its upper part, so that the encapsulating composition of claim 1 seals the entire surface of the organic electronic element.

19. The method for manufacturing an organic electronic device according to claim 18, wherein the step of forming an organic layer comprises inkjet printing, gravure coating or reverse offset coating.

* * * * *